United States Patent
Eberhardt et al.

[11] Patent Number: 6,107,920
[45] Date of Patent: Aug. 22, 2000

[54] RADIO FREQUENCY IDENTIFICATION TAG HAVING AN ARTICLE INTEGRATED ANTENNA

[75] Inventors: Noel H. Eberhardt, Cupertino, Calif.; Sanjar Ghaem, Palatine, Ill.

[73] Assignee: Motorola, Inc., Schaumburg, Ill.

[21] Appl. No.: 09/094,261

[22] Filed: Jun. 9, 1998

[51] Int. Cl.$^7$ .................................................. G08B 13/14
[52] U.S. Cl. ........................................ 340/572.7; 257/673
[58] Field of Search ...................... 340/572.7; 343/872, 343/873; 257/673; 361/767, 783, 808

[56] References Cited

U.S. PATENT DOCUMENTS

| | | | |
|---|---|---|---|
| 3,843,036 | 10/1974 | Monahan et al. | 29/740 X |
| 4,605,844 | 8/1986 | Haggan | 235/380 |
| 4,650,981 | 3/1987 | Foletta | 235/449 |
| 4,783,646 | 11/1988 | Matsuzaki | 340/572.5 |
| 4,900,386 | 2/1990 | Richter-Jorgensen | 340/572.1 X |
| 4,960,983 | 10/1990 | Inoue | 235/449 |
| 4,970,495 | 11/1990 | Matsumoto et al. | 340/572.1 |
| 5,081,445 | 1/1992 | Gill et al. | 340/572.1 |
| 5,175,418 | 12/1992 | Tanaka | 235/439 |
| 5,288,235 | 2/1994 | Sobhani | 439/67 |
| 5,430,441 | 7/1995 | Bickley et al. | 340/825.54 |
| 5,528,222 | 6/1996 | Moskowitz et al. | 340/572.7 |
| 5,566,441 | 10/1996 | Marsh et al. | 29/600 |
| 5,682,143 | 10/1997 | Brady et al. | 340/572.7 |
| 5,710,458 | 1/1998 | Iwasaki | 340/572.7 X |
| 5,767,571 | 6/1998 | Kimura et al. | 257/673 X |
| 5,786,626 | 7/1998 | Brady et al. | 257/673 |
| 5,847,447 | 12/1998 | Rozin et al. | 257/678 |

FOREIGN PATENT DOCUMENTS

| | | |
|---|---|---|
| 0 245 196 | 11/1987 | European Pat. Off. . |
| 0 260 221 | 3/1988 | European Pat. Off. . |
| 0324564 | 7/1995 | European Pat. Off. . |
| 0435137 | 7/1999 | European Pat. Off. . |
| 40 17 934 | 1/1992 | Germany . |

*Primary Examiner*—Thomas Mullen
*Attorney, Agent, or Firm*—Terri S. Hughes; Val Jean F. Hillman

[57] ABSTRACT

A radio frequency identification tag (14) utilizes an antenna (22) formed in association with, and thus integral to, an article, package, package container, label and/or identification badge (10). In a preferred embodiment, a radio frequency identification tag circuit chip assembly (12) is secured to the article (10) and is electrically coupled to the antenna (22) formed on the article (10). Printing a conductive pattern on the article using conductive ink forms a preferred antenna.

35 Claims, 7 Drawing Sheets

RADIO FREQUENCY IDENTIFICATION TAG HAVING AN ARTICLE INTEGRATED ANTENNA

CROSS-REFERENCE TO RELATED APPLICATIONS

The present application is related to the following commonly-assigned prior U.S. patent applications: Ted Geiszler et al., "Remotely powered electronic tag and associated exciter/reader and related method," Ser. No. 08/540,813, filed Oct. 11, 1995, abandoned; Victor Allen Vega et al., "Radio frequency identification tag system using tags arranged for coupling to ground," Ser. No. 09/031,848, filed Feb. 27, 1998; Victor Allen Vega et al., "Radio frequency identification tag arranged for magnetically storing tag state information," Ser. No. 09/041,480, filed Mar. 12, 1998; and Victor Allen Vega, "Radio frequency identification tag with a programmable circuit state," Ser. No. 09/045,357, filed Mar. 20, 1998, the disclosures of which prior applications are hereby expressly incorporated by reference, verbatim and with the same effect as though such disclosures were fully and completely set forth herein.

FIELD OF THE INVENTION

The present invention relates generally to the field of radio-frequency identification tags including, but not limited to, radio frequency identification tags having an article integrated antenna.

BACKGROUND OF THE INVENTION

Radio frequency identification (RFID) tags and radio frequency identification tag systems are known, and find numerous uses. For example, radio frequency identification tags are frequently used for personal identification in automated gate sentry applications protecting secured buildings or areas. Information stored on the radio frequency identification tag identifies the person seeking access to the secured building. A radio frequency identification tag system conveniently provides for reading the information from the radio frequency identification tag at a small distance using radio frequency (RF) data transmission technology. Most typically, the user simply holds or places the radio frequency identification tag near a base station that transmits an excitation signal to the radio frequency identification tag powering circuitry contained on the radio frequency identification tag. The circuitry, responsive to the excitation signal, communicates the stored information from the radio frequency identification tag to the base station, which receives and decodes the information. In general, radio frequency identification tags are capable of retaining and, in operation, transmitting a substantial amount of information—sufficient information to uniquely identify individuals, packages, inventory and the like.

A typical technology for powering and reading a radio frequency identification tag is inductive coupling or a combination of inductive power coupling and capacitive data coupling. Inductive coupling utilizes a coil element in the radio frequency identification tag. The coil element is excited (or "energized") by an excitation signal from the base station to provide power to the radio frequency identification tag circuitry. The radio frequency identification tag coil, or a second tag coil, may be used to transmit and receive the stored information between the radio frequency identification tag and the base station. Radio frequency identification tags relying on inductive coupling are sensitive to orientation of the radio frequency identification tag with respect to the base station since the field created by the excitation signal must intersect the coil element at substantially a right angle for effective coupling. Read ranges for inductively coupled devices are generally on the order of several centimeters. Longer read distances are desirable, and for certain applications, such as electronic animal identification, baggage tracking, parcel tracking and inventory management applications, are necessary.

Another technology for powering and reading radio frequency identification tags is electrostatic coupling such as employed in the radio frequency identification tag systems and radio frequency identification tags disclosed in the above referenced applications. These systems advantageously provide for substantially increased read/write distances over those available in the prior art. Another advantage derived from the use of the systems and tags therein disclosed is that the user need not bring the radio frequency identification tag in close proximity to a base station or to substantially orient the tag with respect to the base station. It is therefore possible to incorporate the antenna elements of the base station into, for example, a doorway or a vestibule, a package conveyer or an article sorting system, and to energize the tag and read the tag information at a greater distance.

To couple either the inductive or electrostatic signals between the base station and the radio frequency identification tag, the tag necessarily includes an antenna having at least one and frequently two antenna elements. Typically, a tag circuit chip and the antenna are electrically coupled and bonded to a tag substrate. The tag dimensions, governed by the tag substrate dimensions, are typically maintained fairly small. Therefore, the antenna is generally size limited. A smaller antenna, however, adversely affects read ranges. Also, the antenna is necessarily formed co-planar with the tag substrate potentially making the tag orientation sensitive. Because it is undesirable and generally impractical to make the radio frequency identification tag larger, effective antenna size remains limited. And, the typical flat tag design also limits the antenna to a flat, orientation sensitive configuration.

To date radio frequency identification tags have been manufactured as self-contained units, i.e., tag circuit chip, antenna and substrate as a singular package. Therefore, not only has the size and configuration of the antenna posed problems with performance of the radio frequency identification tag, the antenna contributes significantly to the cost of a completed tag.

Applications for radio frequency identification tags include personal identification badges, article and/or package identification tags, and electronic article surveillance tags. In many of these applications, the identification badge, the article and/or package is substantially larger than the radio frequency identification tag used to provide the identifying information. However, the size of the identification badge, article or package has not offered an opportunity for increasing the size or reducing the orientation sensitivity of the antenna of a self-contained radio frequency identification tag.

Thus, there is a need for an improved radio frequency identification tag.

BRIEF DESCRIPTION OF THE DRAWINGS

Preferred exemplary embodiments of the invention are illustrated in the accompanying drawings in which like reference numerals represent like parts throughout.

DETAILED DESCRIPTION OF THE PREFERRED EMBODIMENTS

Radio frequency identification tags in accordance with preferred embodiments of the present invention utilize an antenna formed in association with, and thus integral to, an article, package, package container, label and/or identification badge ("article"). In a preferred embodiment of the present invention, a radio frequency identification tag circuit chip assembly is secured to the article and is electrically coupled to the antenna formed on the article. Printing a conductive pattern on the article using conductive ink forms a preferred antenna.

Figure 1:
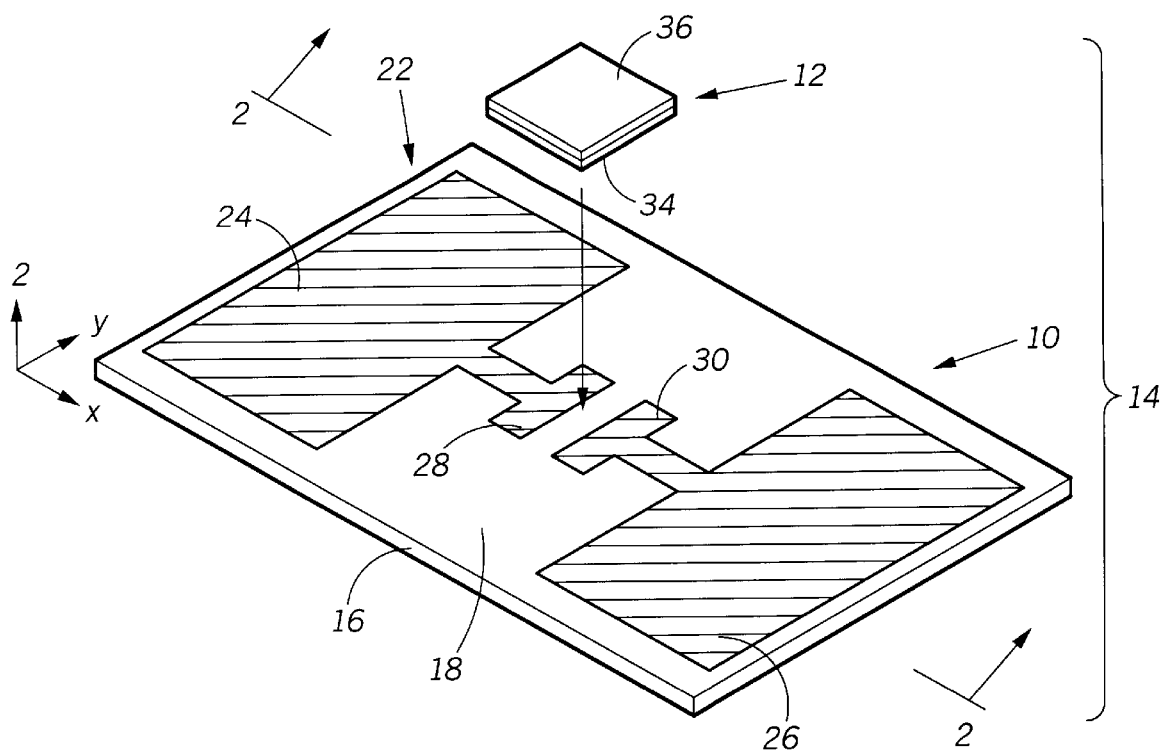
FIG. 1 is an exploded assembly view of a radio frequency identification tag in accordance with a preferred embodiment of the present invention.

Referring to FIG. 1 of the drawings, shown in exploded assembly view radio frequency identification tag 14 includes an article 10 and a radio frequency identification (RFID) tag circuit chip assembly ("chip assembly") 12. Article 10 is shown generally as a substrate 16 formed from a sheet of material having a first surface 18 and a second surface 20. It will be appreciated that substrate 16 may form the basis for a personal identification badge, a label, a package container (such as a box or envelope) and the like. Moreover, the substrate material may be any suitable material for the particular application such as plastic (including polyester and metalized polyester material), paper, synthetic paper, reinforced paper, cardboard, synthetic paper coated cardboard and the like. As will be described with respect to alternate preferred embodiments of the invention below, a radio frequency identification tag circuit chip may be attached directly to a substrate arranged with an integrally formed antenna. The arrangement of chip assembly 12 advantageously provides manufacturing convenience since many chip assemblies may be produced in high volume using automated techniques. The chip assemblies 12 are relatively small, on the order of 1–2 cm square, and thus easier to store, ship and handle versus the article to which it is attached. Moreover, chip assembly 12, as will be described, provides for a substantially simplified way of attaching the radio frequency identification tag circuit chip to an article, and concomitantly coupling the same to the integrally formed antenna.

Formed on first surface 18 of article 10 is an antenna 22 including a first antenna element 24 and a second antenna element 26. Each of first antenna element 24 and second antenna element 26 are a formed from a conductive material that is bonded or otherwise secured to, and thus integral to, article 10. Most preferably, each of first antenna element 24 and second antenna element 26 are formed by printing, using a suitable printable conductive medium. For example, a carbon/graphite based conductive ink forms an effective antenna 22 when printed onto paper and/or cardboard. Synthetic and coated papers may alternatively be used, but at added cost. Silver and other precious metal inks may be used particularly for printing on plastic materials, but are less preferred due to higher material costs. Antenna 22 is shown to have a generally broken "H" shape as would be suitable for use in an electrostatic signal application. It will be appreciate that other patterns more suitable to, for example, inductive coupling may be printed without departing from the fair scope of the present invention. Each of first antenna element 24 and second antenna element 26 include at generally the center of the broken "H" pattern, respectively, a first coupling region 28 and a second coupling region 30. Most preferably, antenna 22 may be made substantially larger than in traditional radio frequency identification tag construction, approaching the surface area of surface 18. Each of first coupling region 28 and second coupling region 30 includes a conductive pad area for electrically coupling to chip assembly 12 by means of a layer 34 of anisotropic adhesive (FIG. 2).

A preferred anisotropic adhesive is 3M 9703 adhesive available from 3M Corporation. The preferred adhesive is anisotropic in that it conducts in the "z" or vertical direction only (FIG. 1). The adhesive is manufactured to include metallic coated micro-sized pellets in an adhesive substrate that make electrical contact from the top surface to the lower surface of adhesive layer 34. Electrical contact is not made in either of the "x" or "y" directions, i.e., the plane of adhesive layer 34. Thus, adhesive may be applied in a complete layer without shorting across adjacent conductors.

Figure 2:
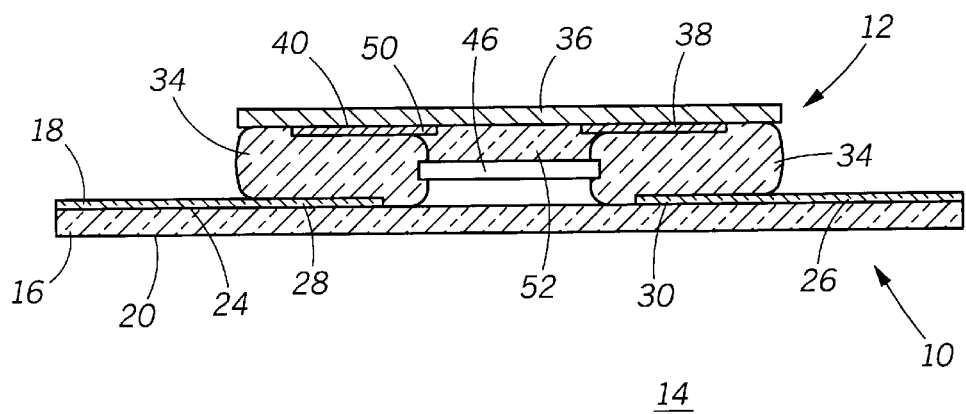
FIG. 2 is a cross-section view taken along line 2—2 of FIG. 1.
Figure 3:
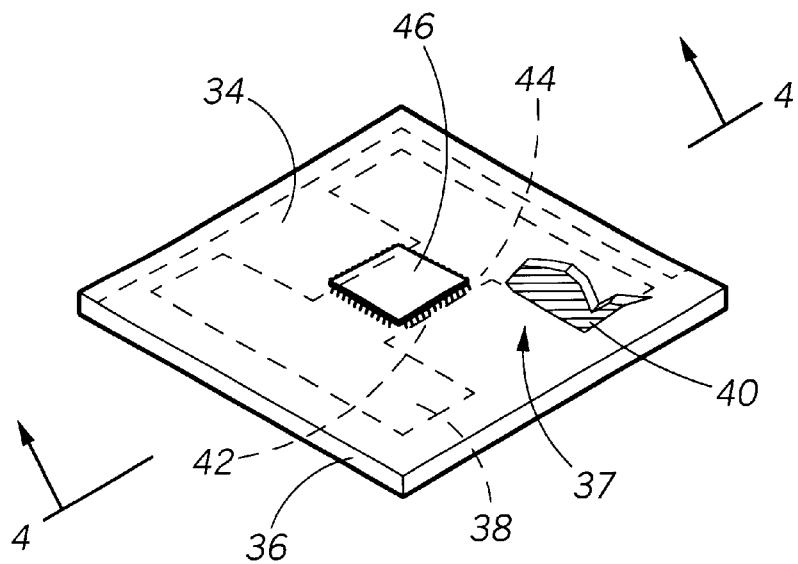
FIG. 3 is a perspective view of a radio frequency identification tag circuit chip assembly partially broken away to reveal a conductor element formed therein.
Figure 4:
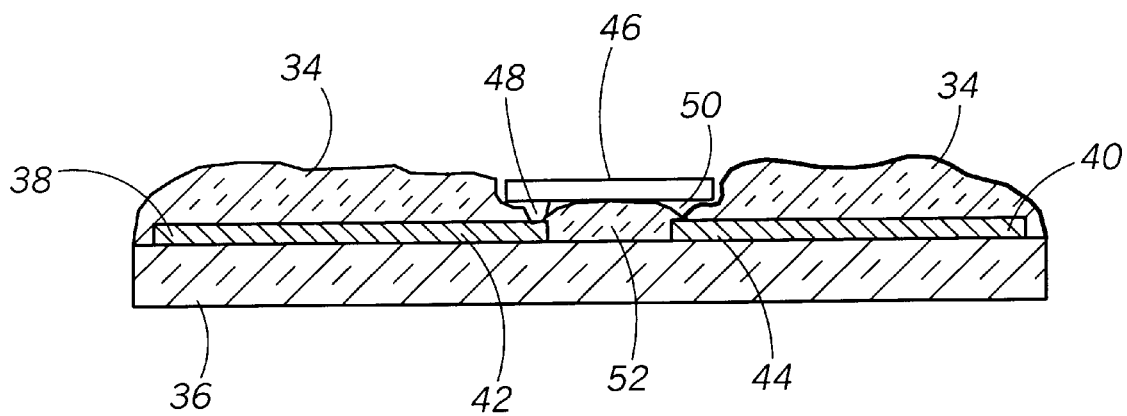
FIG. 4 is a cross-section view taken along line 4—4 of FIG. 3.

With reference then to FIG. 2 and further reference to FIG. 3 and FIG. 4, chip assembly 12 includes a substrate 36 on which a conductive pattern 37 including a first conductive member 38 and a second conductive member 40 is formed. Substrate 36 is preferably a thin, flexible sheet of paper, plastic, synthetic paper or other similar material with paper being a preferred, low cost substrate material. Each of first conductive member 38 and second conductive member 40 are preferably formed by printing conductive pattern 37 onto substrate 36 using a suitable printable conductive medium. Suitable conductive inks include carbon/graphite bearing inks, precious metal bearing inks and the like selected for compatibility with substrate 36.

As seen in FIG. 3, a preferred conductive pattern 37 formed by first conductive member 38 and second conductive member 40 is a broken "H" providing a substantial area for coupling to antenna 22 and providing a first chip coupling region 42 and a second chip coupling region 44, respectively. Secured to substrate 36 and coupled to first and second coupling regions 42 and 44 by means of layer 34 is a radio frequency identification tag circuit chip ("circuit chip") 46.

In the past, circuit chip 46 has been available from Temic, North America, Inc., Basking Ridge, N.J., as well as from Motorola's Indala Corporation, San Jose Calif. Circuit chip 46 is formed with a first conductive pad 48 and a second conductive pad 50 arranged for coupling to conductive pattern 37. As shown, first conductive pad 48 and second conductive pad 50 are "bumped" pads. That is, they project outwardly from the surface of circuit chip 46 in contrast to "surface" pads, which are formed substantially coplanar with the outer surface of a circuit chip. When secured to substrate 36, first conductive pad 48 contacts first chip coupling region 42 and conductive pad 50 contacts second chip coupling region 44 providing an operable, electrical coupling therebetween. A small region 52 of layer 34 is slightly compressed between circuit chip 46 and substrate 36 forming a strong mechanical bond of circuit chip 46 to substrate 36. No particular preference exists for the use of bumped pads, and either bumped pads, surface pads or recessed pads (i.e., conductive pads formed recessed into an outer surface of circuit chip 46) may be selected based upon cost and the particular application.

As is appreciated from the foregoing discussion, and in accordance with a preferred embodiment of the present invention, radio frequency identification tag 14 is formed by joining circuit chip assembly 12 to article 10 having an integrally formed antenna 22. The only size limitation for antenna 22 is thus the available non-metallic and/or non-conductive surface area of article 10. In this manner, a substantially larger antenna than would otherwise be possible on a traditional radio frequency identification tag may be achieved. The direct benefits included increased read distances and potentially reduce orientation sensitivity. Additionally, antenna 22 may be printed on the article using inexpensive carbon/graphite bearing conductive ink, and may be formed on a number of non-coplanar and/or non-parallel surfaces of article 10 thereby reducing orientation sensitivity. Thus, the performance improvements are achieved at reduced costs.

Figure 5:
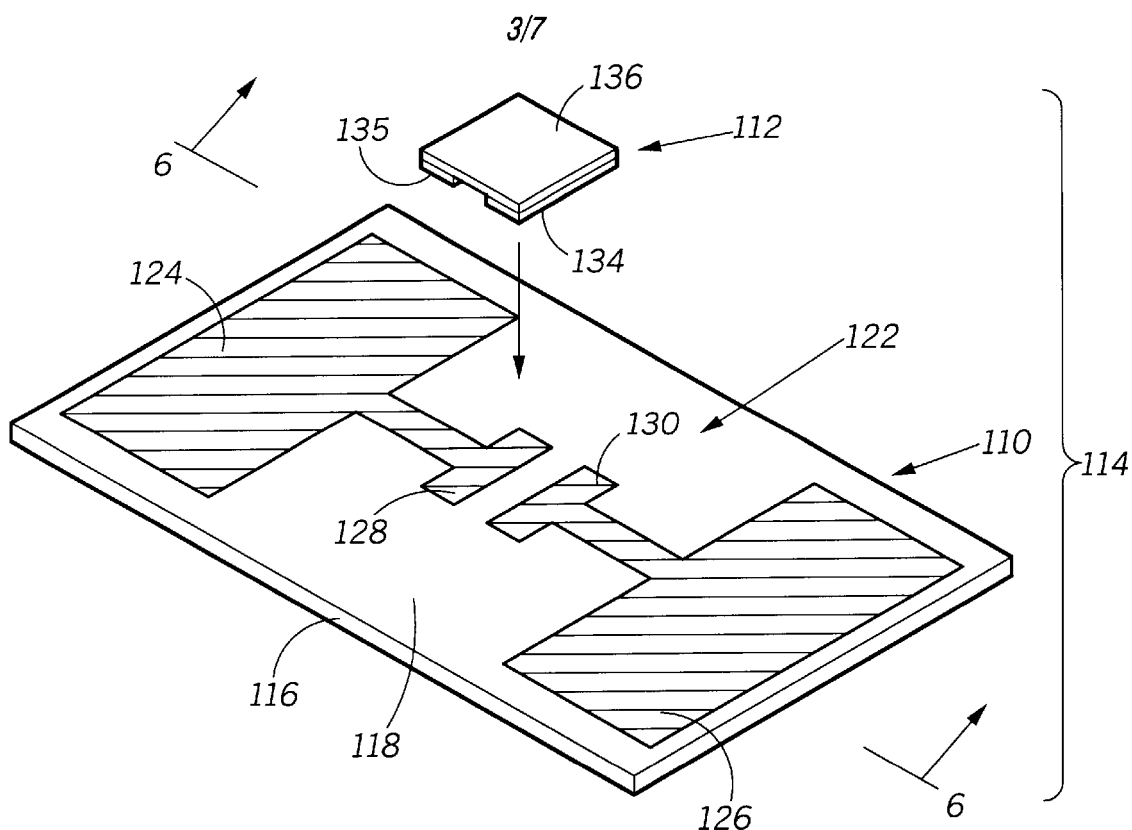
FIG. 5 is an exploded assembly view of a radio frequency identification tag in accordance with a preferred embodiment of the present invention.

With reference now to FIG. 5 of the drawings, shown in exploded assembly view a radio frequency identification tag 114 includes an article 110 and a radio frequency identification tag circuit chip assembly ("chip assembly") 112. Article 110 is shown generally as a substrate 116 formed from a sheet of material having a first surface 118 and a second surface 120. It will be appreciated that substrate 116 may form the basis for a personal identification badge, a label, a package container (such as a box or envelope) and the like. Moreover, the substrate material may be any suitable material for the particular application such as paper, plastic (including polyester and metalized polyester material), synthetic paper, reinforced paper, cardboard, synthetic paper coated cardboard and the like, with paper providing a suitable, low cost and thus preferred substrate material.

Figure 6:
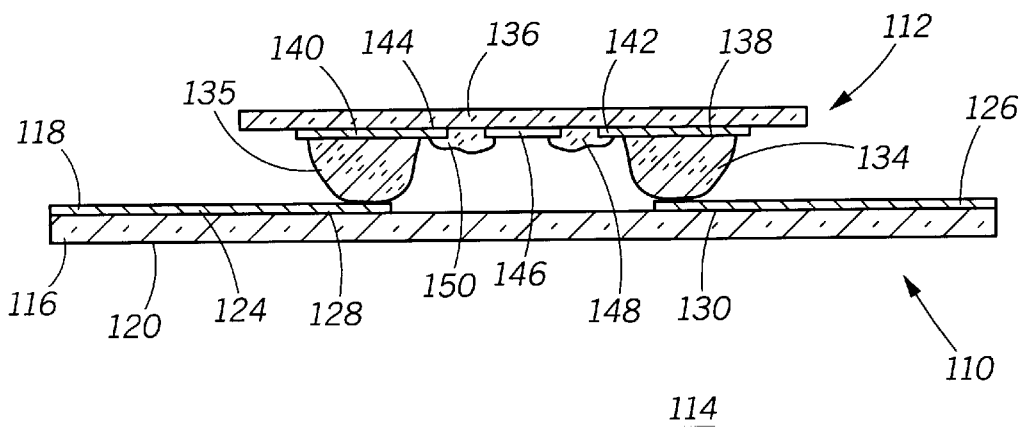
FIG. 6 is a cross-section view taken along line 6—6 of FIG. 5.

Formed on first surface 118 is an antenna 122 including a first antenna element 124 and a second antenna element 126. Each of first antenna element 124 and second antenna element 126 are formed from a conductive material that is bonded or otherwise secured to, and thus integral to, article 110. Most preferably, each of first antenna element 124 and second antenna element 126 are formed by printing, using a suitable printable conductive medium. For example, a carbon/graphite based conductive ink forms an effective antenna 122 when printed onto paper, cardboard, coated cardboard and/or synthetic paper. Silver and other precious metal inks may be used particularly for printing on plastic materials, but are less preferred due to higher material costs. Antenna 122 is shown to have a generally broken "H" shape as would be suitable for use in an electrostatic signal application. It will be appreciated that other patterns more suitable to, for example, inductive coupling may be printed without departing from the fair scope of the present invention. Each of first antenna element 124 and second antenna element 126 include at generally the center of the broken "H" pattern, respectively, a first coupling region 128 and a second coupling region 130. Most preferably, antenna 122 may be made substantially larger than in traditional radio frequency identification tag construction, approaching the surface area of surface 118. Each of first coupling region 128 and second coupling region 130 includes a conductive pad area for electrically coupling to chip assembly 112 by means of adhesive layer 134 and adhesive layer 135 (FIG. 6). Since adhesive layer 134 and adhesive layer 135 are separate from each other on chip assembly 112, an isotropic adhesive may be used. A preferred isotropic adhesive is #8001 available from Adhesives Research, Inc.

Figure 7:
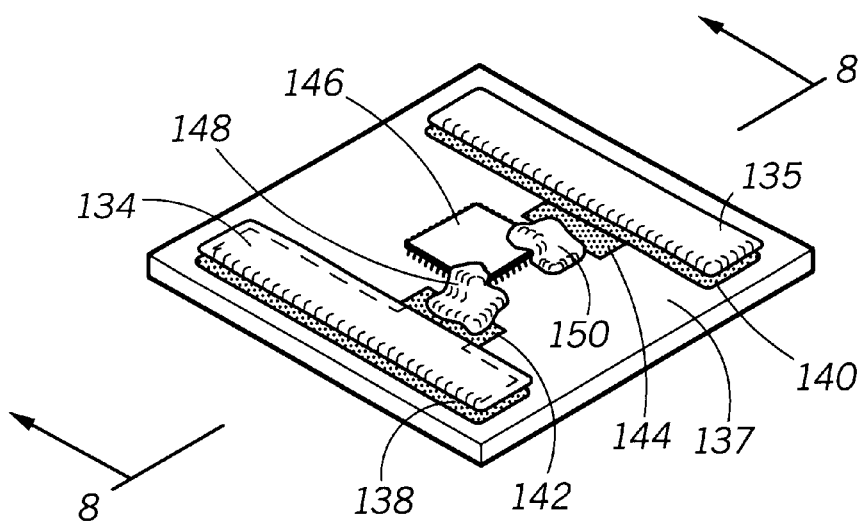
FIG. 7 is a perspective view of a radio frequency identification tag circuit chip assembly.
Figure 8:
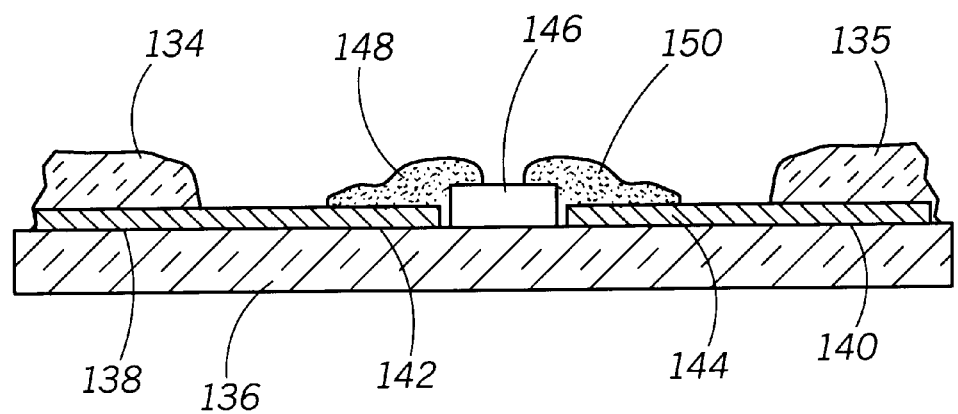
FIG. 8 is a cross-section view taken along line 8—8 of FIG. 7.

With reference then to FIG. 6 and further reference to FIG. 7 and FIG. 8, chip assembly 112 includes a substrate 136 onto which a conductive pattern 137 including a first conductive member 138 and a second conductive member 140 is formed. Substrate 136 is preferably a thin, flexible sheet of paper, plastic, synthetic paper or other similar material. Each of first conductive member 138 and second conductive member 140 are preferably formed by printing conductive pattern 137 onto substrate 136 using a suitable printable conductive medium. Suitable conductive inks include carbon/graphite bearing inks, precious metal bearing inks and the like selected for compatibility with substrate 136.

As seen in FIG. 7, a preferred conductive pattern 137 formed by first conductive member 138 and second conductive member 140 is a broken "H" providing a substantial area for coupling to antenna 122 and providing a first chip coupling region 142 and a second chip coupling region 144, respectively. Secured to substrate 136 using a suitable adhesive, such as an epoxy adhesive, is a radio frequency identification tag circuit chip ("circuit chip") 146.

In the past, circuit chip 146 has been available from Temic, North America, Inc., Basking Ridge, N.J., as well as from Motorola's Indala Corporation, San Jose Calif. Circuit chip 146 is formed with a first conductive pad and a second conductive pad (not shown) for coupling to an antenna, such as antenna 122. The first and second conductive pads may be "surface" pads, "recessed" pads, or "bumped" pads as desired. Circuit chip 146 is secured to substrate 136 with the first and second conductive pads facing away from substrate 136. Once secured to substrate 136, a layer of conductive adhesive 148 electrically couples the first conductive pad to first chip coupling region 142 and a layer of conductive adhesive 150 electrically couples the second conductive pad to second chip coupling region 144 providing an operable, electrical coupling therebetween.

Similar to radio frequency identification tag 14, radio frequency identification tag 114 is formed by joining circuit chip assembly 112 to article 110 having an integrally formed antenna 122. Thus, the only size limitation for antenna 122 is the available non-metallic, non-conductive surface area of article 110. In this manner, a substantially larger antenna than would otherwise be possible to provide on a traditional radio frequency identification tag may be achieved. Also, orientation sensitivity may be reduced by forming antenna 122 on non-parallel surfaces. The direct benefits included increased read distances, potentially reduce orientation sensitivity and reduced cost.

A plurality of chip assemblies 12 or 112 may be prepared and secured to a transport medium (not shown) by means of layer 34 and layer 134 and layer 135, respectively. The transport medium permits easy removal of individual chip assemblies therefrom, and may be a sheet or roll of material. From the transport medium, a chip assembly may be removed and then secured to an article. For example, in an inventory and packaging operation, as packages are assembled, chip assemblies may be applied as necessary for tracking such packages.

Figure 9:
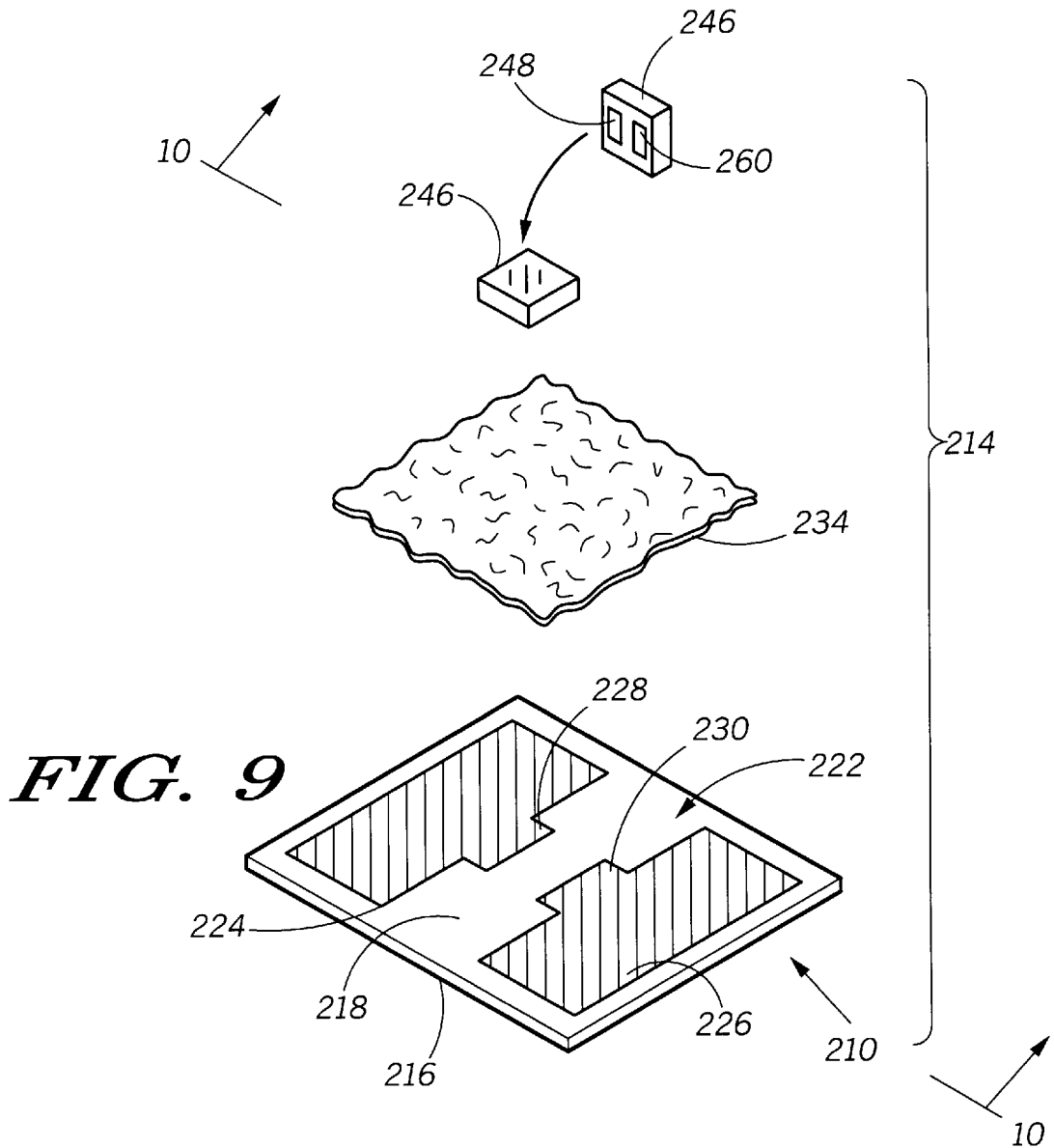
FIG. 9 is an exploded assembly view of a radio frequency identification tag in accordance with an alternate preferred embodiment of the present invention.

Referring now to FIG. 9 of the drawings, shown in exploded assembly view, radio frequency identification tag 214 is formed by directly joining a radio frequency identification tag circuit chip ("circuit chip") 246 to an article 210 having an integrally formed antenna 222. Article 210 is shown generally as a substrate 216 formed from a sheet of material having a first surface 218 and a second surface 220. It will be appreciated that substrate 216 may form the basis for a personal identification badge, a label, a package container (such as a box or envelope) and the like. Moreover, the substrate material may be any suitable material for the particular application such as paper, plastic (including polyester and metalized polyester material), synthetic paper, reinforced paper, cardboard, coated cardboard and the like.

Formed on first surface 218 is an antenna 222 including a first antenna element 224 and a second antenna element 226. Each of first antenna element 224 and second antenna element 226 are formed from a conductive material that is bonded or otherwise secured to, and thus integral to, article 210. Most preferably, each of first antenna element 224 and second antenna element 226 are formed by printing, using a suitable printable conductive medium. For example, a carbon/graphite based conductive ink forms an effective antenna 222 when printed onto synthetic paper and/or synthetic paper coated cardboard. Silver and other precious metal inks may be used particularly for printing on plastic materials, but are less preferred due to higher material costs. Antenna 222 is shown to have a generally broken "H" shape as would be suitable for use in an electrostatic signal application. It will be appreciated that other patterns more suitable to, for example, inductive coupling may be printed without departing from the fair scope of the present invention. Each of first antenna element 224 and second antenna element 226 include at generally the center of the broken "H" pattern, respectively, a first coupling region 228 and a second coupling region 230. Most preferably, antenna 222 may be made substantially larger, approaching the surface area of surface 218 of article 210, than in traditional radio frequency identification tag construction.

Figure 10:
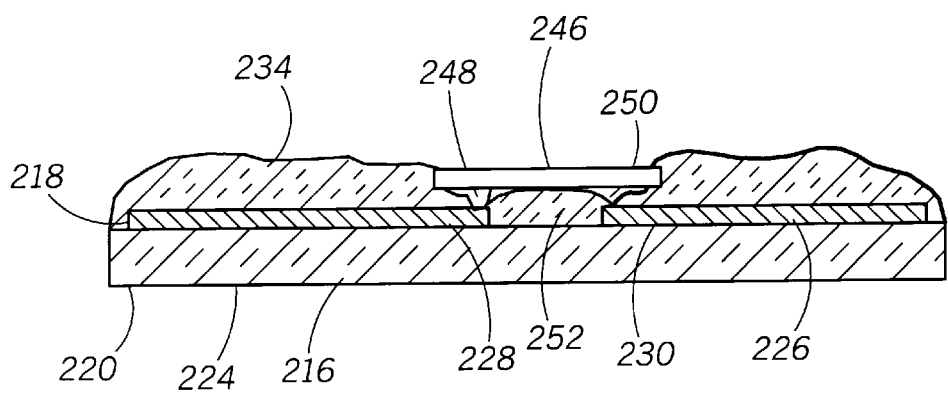
FIG. 10 is a cross-section view taken along line 10—10 of FIG. 9.

Referring now to FIG. 10, circuit chip 246 is bonded to article 210 by means of a layer 234 of adhesive. In the past circuit chip 246 has been available from Temic, North America, Basking Ridge, N.J., as well as from Motorola's Indala Corporation, San Jose Calif. Circuit chip 246 is formed with a first conductive pad 248 and a second conductive pad 250 for coupling to antenna 222. As shown, first conductive pad 248 and second conductive pad 250 are "bumped" pads, however, surface pads, recessed pads, or other suitable conductive pads formed on circuit chip 246 may be used. Conductive pad 248 and conductive pad 250 are arranged for respectively electrically contacting first chip coupling region 242 and second chip coupling region 244 providing an operable, electrical coupling therebetween. A small region 252 of layer 234 is slightly compressed between circuit chip 246 and substrate 216 forming a strong mechanical bond. A protective sheet (not shown) may then be applied over circuit chip 246 and layer 234.

Figure 11:
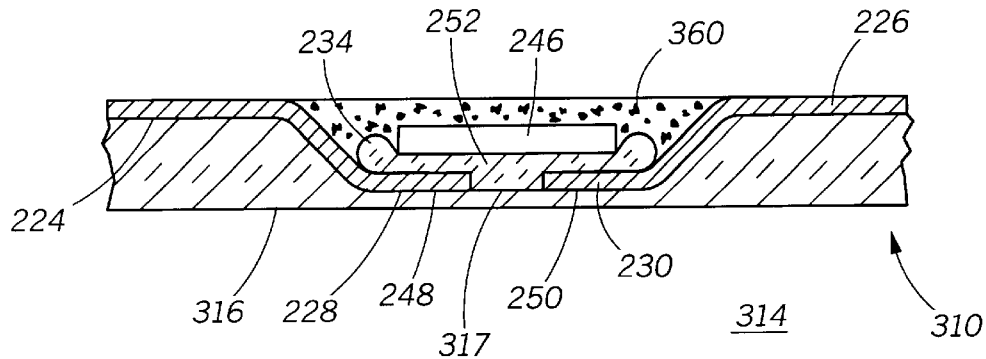
FIG. 11 is a cross-section view similar to the view of FIG. 10 and illustrating an alternate preferred embodiment of the present invention.

With reference to FIG. 11, radio frequency identification tag 314 in accordance with still another alternate preferred embodiment is shown with like reference numerals indicating like elements as shown and described with respect to radio frequency identification tag 214. Thus, and as seen in FIG. 11, radio frequency identification tag 314 is formed by directly joining circuit chip 246 to an article 310 having an integrally formed antenna 222. Article 310 includes a substrate 316 that is formed with a locally compressed region 317 into which circuit chip 246 is positioned and secured to article 310. In this manner, circuit chip 246 is positioned slightly below surface 218 and is thereby protected from damage during use of article 310. It will be further appreciated that article 310 may be formed with the above described compressed region 317 and arranged to receive a circuit chip assembly, such as circuit chip assembly 12 or circuit chip assembly 112 described above. Once secured into region 317, circuit chip 246 may be surrounded and/or covered by a potting material 360. Preferably the potting material is an ultraviolet curable polymer material that can be deposited over and around circuit chip 246 in region 317, and quickly cured by exposure to ultraviolet light. A protective cover may also be employed and secured over circuit chip 246.

Figure 12:
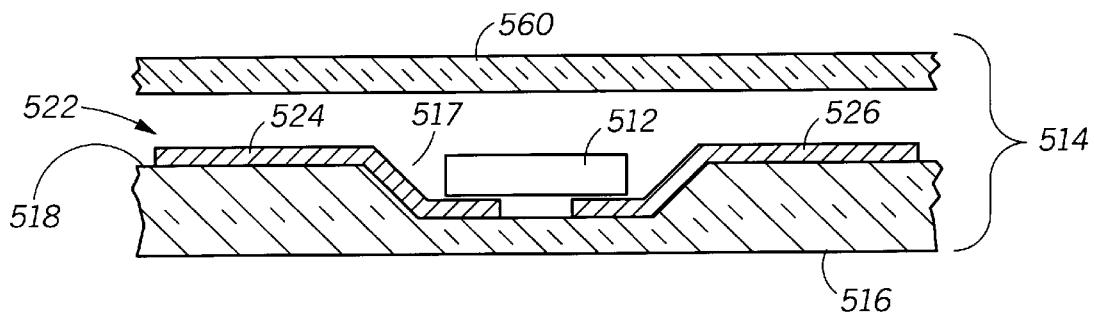
FIG. 12 is a cross-section view of a radio frequency identification tag in accordance with an alternate preferred embodiment of the present invention.

Radio frequency identification tag 514 is shown in FIG. 12 and includes a radio frequency identification tag circuit chip assembly 512 constructed in accordance with preferred embodiments of the present invention secured to substrate 516 within a recess 517. Recess 517 is formed as a compressed portion of substrate 516 to a depth sufficient that chip assembly 512 is disposed below a surface 518 of substrate 516. Formed on surface 518 is an antenna 522 including a first conductive portion 524 and a second conductive portion 526. Preferably antenna 522 is formed by print depositing a conductive ink onto surface 518. An anisotropic adhesive (not shown) is preferably used to bond chip assembly 512 within recess 517 such that chip assembly 512 electrically, and operably, couples to antenna 522. An accurately applied isotropic adhesive may also be used to bond and electrically couple chip assembly 512 without departing from the fair scope of the present invention. It will be further appreciated that chip assembly 512 may be a radio frequency identification tag circuit chip without departing from the fair scope of the present invention. Once chip assembly 512 is bonded into recess 517, a cover 560 is bonded to surface 518 and antenna 522 forming radio frequency identification tag 514 having a thin, substantially flat configuration. In fact, the overall thickness of radio frequency identification tag 514 is not substantially greater than the thickness of chip assembly 512. It will also be appreciated that substrate 516 and cover 560 may comprise a portion of an article. For example, substrate 516 and cover 560 may form a portion of a wall of a laminated package such as a cardboard box, label, envelope, ticket, waybill or the like.

Figure 13:
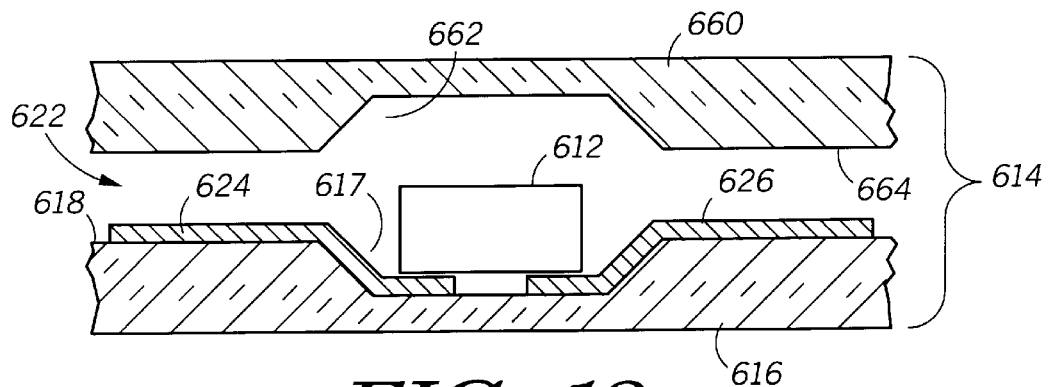
FIG. 13 is a cross-section view of a radio frequency identification tag in accordance with an alternate preferred embodiment of the present invention.

Referring to FIG. 13, a radio frequency identification tag 614 includes a radio frequency identification tag circuit chip assembly 612 constructed in accordance with preferred embodiments of the present invention secured to substrate 616 within a recess 617. Recess 617 is preferably formed as a compressed portion of substrate 616 to a depth of about one half the thickness of chip assembly 612, or in other words, such that an upper portion of chip assembly 612 is disposed above a surface 618. Formed on surface 618 is an antenna 622 including a first conductive portion 624 and a second conductive portion 626. Preferably antenna 622 is formed by print depositing conductive ink onto surface 618. An anisotropic adhesive (not shown) is preferably used to bond chip assembly 612 within recess 617 such that chip assembly 612 electrically, and operably, couples to antenna 622. An accurately applied isotropic adhesive may also be used to bond and electrically couple chip assembly 612 without departing from the fair scope of the present invention. It will be further appreciated that chip assembly 612 may be a radio frequency identification tag circuit chip without departing from the fair scope of the present invention. Cover 660 is formed to include a cover recess 662. Cover recess 662 is formed as a compressed portion of cover 660 to a depth of about one half the thickness of chip assembly 612 as measured from surface 664. Once chip assembly 612 is bonded into recess 617, cover 660 is bonded to surface 618 and antenna 622 with cover recess 662 registering with recess 517 and together forming radio frequency identification tag 614 having a thin, substantially flat configuration. In fact, the overall thickness of radio frequency identification tag 614 is not substantially greater than the thickness of chip assembly 612. It will also be appreciated that substrate 616 and cover 660 may comprise a portion of an article. For example, substrate 616 and cover 660 may form a portion of a wall of a laminated package such as a cardboard box, label, envelope, ticket, waybill or the like.

Figure 14:
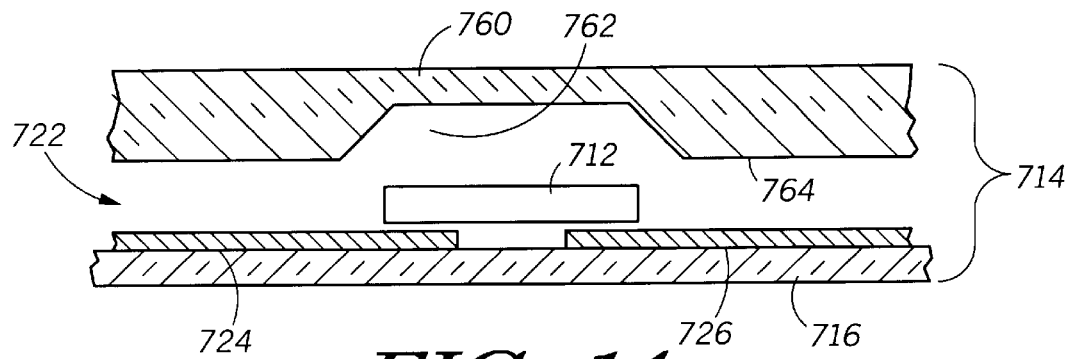
FIG. 14 is a cross-section view of a radio frequency identification tag in accordance with an alternate preferred embodiment of the present invention.

Referring to FIG. 14, a radio frequency identification tag 714 includes a radio frequency identification tag circuit chip assembly 712, constructed in accordance with preferred embodiments of the present invention secured to substrate 716. Formed on an upper surface 718 of substrate 716 is an antenna 722 including a first conductive portion 724 and a second conductive portion 726. Preferably antenna 722 is formed by print depositing conductive ink onto surface 718. An anisotropic adhesive (not shown) is preferably used to bond chip assembly 712 to surface 718 such that chip assembly 712 electrically, and operably, couples to antenna 722. An accurately applied isotropic adhesive may also be used to bond and electrically couple chip assembly 712 without departing from the fair scope of the present invention. It will be further appreciated that chip assembly 712 may be a radio frequency identification tag circuit chip with departing from the fair scope of the present invention. Cover 760 is formed to include a cover recess 762. Cover recess 762 is formed as a compressed portion of cover 760 to a depth slightly greater than the thickness of chip assembly 712 as measured from surface 764. Once chip assembly 712 is bonded to surface 718, cover 760 is bonded to surface 718 and antenna 722 with cover recess 762 surrounding chip assembly 712, thus forming radio frequency identification tag 714 having a thin, substantially flat configuration. In fact, the overall thickness of radio frequency identification tag 714 is not substantially greater than the thickness of chip assembly 712. It will also be appreciated that substrate 716 and cover 760 may comprise a portion of an article. For example, substrate 716 and cover 760 may form a portion of a wall of a laminated package such as a cardboard box, label, envelope, ticket, waybill or the like.

Figure 15:
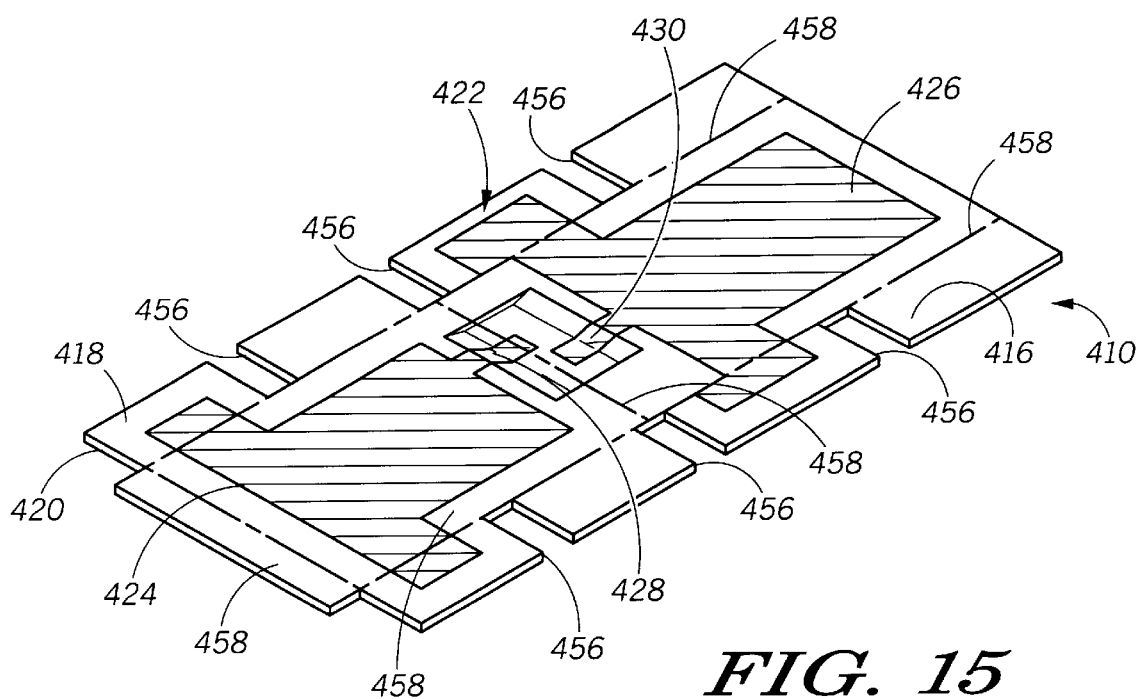
FIG. 15 is a perspective view of an unassembled package container in accordance with a preferred embodiment of the present invention.
Figure 16:
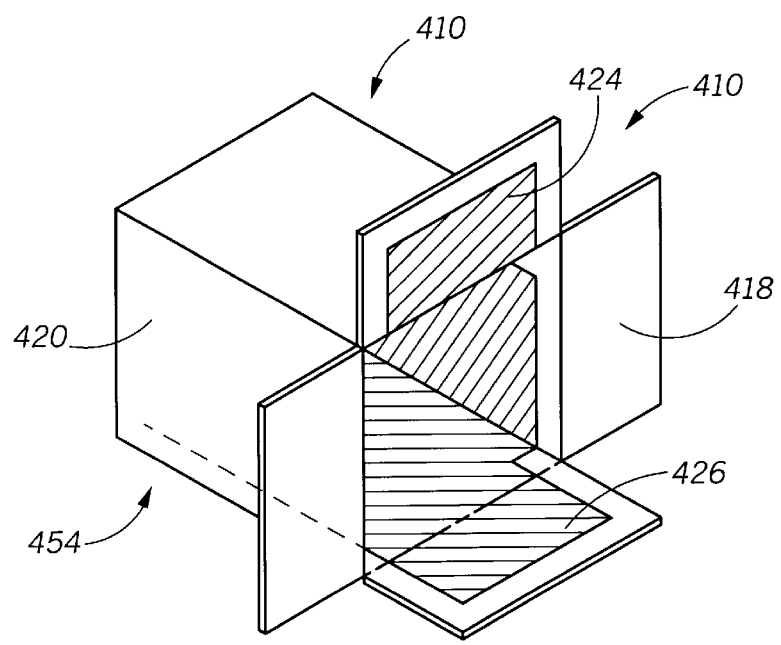
FIG. 16 is a perspective view of an assembled package container in accordance with a preferred embodiment of the present invention.

In accordance with another aspect of the present invention, and with reference to FIG. 15 and FIG. 16 a package container 410 suitable for use in a radio frequency identification tag system (not shown) includes an integrally formed antenna 422. FIG. 15 illustrates package container 410 in an unassembled state. Package container 410 includes a package medium 416 formed from a sheet of paper, cardboard or coated cardboard material, with simple paper or cardboard providing a preferred, low cost medium. A plurality of cutouts 456 and a plurality of scores 458 are formed into package medium 416 allowing package medium 416 to be folded into a box shape 454 (FIG. 16) as is very well known in the art.

Formed on first surface 418 of package medium 416 is an antenna 422 including a first antenna element 424 and a second antenna element 426. Each of first antenna element 424 and second antenna element 426 are a formed from a conductive material that is bonded or otherwise secured to, and thus integral to, package container 410. Most preferably, each of first antenna element 424 and second antenna element 426 are formed by printing, using a suitable printable conductive medium. For example, a carbon/graphite based conductive ink forms an effective antenna 422 when printed onto paper, cardboard and/or coated cardboard. Antenna 422 is shown to cover generally all of the available area of surface 418, and each of first antenna element 424 and second antenna element 426 include at a center portion of package medium 416, a first coupling region 428 and a second coupling region 430. Each of first coupling region 428 and second coupling region 430 are arranged to electrically couple a radio frequency identification tag chip assembly or a radio frequency identification tag circuit chip in accordance with the present invention.

A primary advantage that package container 410 provides is the substantial amount of antenna surface area. The area of antenna 422 is orders of magnitude larger than available in traditional radio frequency identification tags. Moreover, since antenna 422 covers substantially the entire interior surface 418 of package container 410, orientation sensitivity is greatly reduced. Antenna 422 may be printed using relatively inexpensive carbon/graphite bearing ink, and chip assemblies are added only as required, and when the package container 410 is assembled thereby reducing cost.

In summary, referring again to FIG. 1, there has been disclosed a radio frequency identification tag 14 including a radio frequency identification tag circuit chip 46 secured to an article 10. The article 10 is formed to include an antenna 22 and the radio frequency identification tag circuit chip 46 is electrically coupled to the antenna.

With reference to FIG. 2, the radio frequency identification tag 14 may preferably comprise a radio frequency identification tag circuit chip assembly 12. The circuit chip assembly 12 includes a substrate 36 including a conductive pattern 37. The radio frequency identification tag circuit chip 46 is coupled to the conductive pattern 37. The conductive pattern 37 is arranged to couple to the antenna 22 formed integral to the article 10.

Referring to FIG. 12, in another preferred embodiment of the present invention, a radio frequency identification tag 514 includes a substrate 516 formed to with a recess 517 in a surface 518 thereof and an antenna 522 formed on the surface. A radio frequency identification tag circuit chip assembly 512 is secured within the recess and is electrically coupled to the antenna. A cover is secured over the surface.

Referring to FIG. 13, in still another preferred embodiment of the present invention, a radio frequency identification tag 614 includes a substrate 616 formed to include a recess 617 in a surface 618 thereof and an antenna 622 formed on the surface. A radio frequency identification tag circuit chip 612 is secured within the recess and electrically coupled to the antenna. A cover 660 is secured over the surface, and the cover is formed to include a cover recess 662, and the cover recess arranged to register with the recess.

Referring to FIG. 14, in yet another preferred embodiment of the present invention, a radio frequency identification tag 714 includes a substrate 716 having an antenna 722 formed on a surface 718 thereof. A radio frequency identification tag circuit chip assembly 712 is secured to the surface and electrically coupled to the antenna. A cover 760 is secured over the surface, and the cover is formed to include a cover recess 762 with the cover recess arranged to surround the radio frequency identification tag circuit chip.

Referring to FIG. 15, another aspect of the present invention provides a package container arranged for use in a radio frequency identification tag system including a package medium 416 and an antenna 422 formed on a surface 418 of the package medium.

Size and orientation limitations of radio frequency identification tag antenna are overcome in the present invention by forming the antenna as part of an article to be tracked and securing to the article a radio frequency identification tag circuit chip assembly. The antenna is conveniently constructed by printing on a surface of the article with conductive ink. Radio frequency identification tag circuit chip assemblies are economically produced in mass.

Read ranges are increased by utilizing antenna of substantially larger area formed as part of the article.

Orientation sensitivity is reduced by forming the antenna on non-parallel surfaces of the article.

Radio frequency identification tag costs are reduced by forming the antenna on the article using inexpensive conductive inks.

Inadvertent dislodging of the circuit chip assembly is avoided by providing a recessed area of the substrate into which the circuit chip assembly is secured and coupled to the antenna.

Many additional changes and modifications could be made to the invention without departing from the fair scope and spirit thereof. The scope of some changes is discussed above. The scope of others will become apparent from the appended claims.

We claim:

1. An antenna arranged for use with an electrostatic radio frequency identification (RFID) tag, the antenna comprising:
   a first substrate; and
   a conductive pattern formed on the first substrate, the conductive pattern including a first antenna element having a first coupling region and a second antenna element having a second coupling region, the first antenna element isolated from the second antenna element by a non-conductive region disposed in the conductive pattern.

2. The antenna of claim 1, wherein the first substrate is at least part of one of a badge, a package, a container, and a label.

3. The antenna of claim 1, wherein the conductive pattern is a conductive ink printed on the first substrate, only.

4. The antenna of claim 1, wherein the first coupling region and the second coupling region are electrically coupled to a radio frequency identification tag circuit chip.

5. The antenna of claim 1, wherein the first antenna element and the second antenna element are arranged for electrostatically coupling to an interrogator.

6. The antenna of claim 1, wherein the first substrate comprises a first surface, the conductive pattern being formed on the first surface.

7. The antenna of claim 6, wherein the conductive pattern covers substantially the entire surface area of the first surface.

8. The antenna of claim 1, wherein the first coupling region and the second coupling region are electrically coupled to a RFID chip assembly.

9. The antenna of claim 8, wherein the RFID chip assembly comprises an RFID circuit chip.

10. The antenna of claim 9, wherein the RFID circuit chip is attached to a conductive pattern disposed on a second substrate by at least one of an isotropic adhesive and an anisotropic adhesive.

11. A package container arranged for use with an electrostatic radio frequency identification tag, the package container comprising:
    a package medium, and
    a conductive pattern formed on the package medium, the conductive pattern including a first antenna element having a first coupling region and a second antenna element having a second coupling region, and the package medium having a locally compressed region about the first coupling region and the second coupling region.

12. The package container of claim 11, wherein the conductive pattern forms an antenna for the electrostatic radio frequency identification tag.

13. The package container of claim 11, wherein the conductive pattern is conductive ink printed on the package medium.

14. The package container of claim 11, wherein the first coupling region and the second coupling region are electrically coupled to a radio frequency identification tag circuit chip.

15. The package container of claim 11, wherein the first antenna element and the second antenna element are arranged for electrostatically coupling to an interrogator.

16. The package container of claim 11, wherein the package medium comprises a substrate including a plurality of scores and a plurality of cutouts, the plurality of scores and the plurality of cutouts arranged for forming the substrate into a box.

17. The package container of claim 11, wherein the package medium comprises a first surface and a second surface, the first surface and the second surface being non-parallel and the conductive pattern being formed on the first surface.

18. An electrostatic radio frequency identification (RFID) tag comprising a first substrate formed to include a recess in a surface thereof and an antenna formed on the surface, the antenna extending into the recess and contacting side walls thereof, and a RFID chip assembly secured within the recess and electrically coupled to the antenna.

19. The electrostatic radio frequency identification (RFID) tag of claim 18, wherein the RFID chip assembly comprises an RFID circuit chip.

20. The electrostatic radio frequency identification (RFID) tag of claim 19, wherein a conductive adhesive bonds the RFID circuit chip to a conductive pattern disposed on a second substrate comprising a part of the RFID chip assembly.

21. The radio frequency identification tag of claim 20, the conductive adhesive comprising at least one of an anisotropic adhesive and an isotropic adhesive.

22. The radio frequency identification (RFID) tag of claim 18, wherein the first substrate and a cover form a portion of an article.

23. The radio frequency identification (RFID) tag of claim 22, the first substrate and the cover forming a portion of a laminated package.

24. A radio frequency identification tag comprising a substrate formed to include a recess in a surface thereof and an antenna formed on the surface, a radio frequency identification tag circuit chip secured within the recess and electrically coupled to the antenna, and a cover secured over the surface, the cover formed to include a cover recess, and the cover recess arranged to register with the recess.

25. The radio frequency identification tag of claim 24, the radio frequency identification tag circuit chip comprising a radio frequency identification tag circuit chip assembly.

26. The radio frequency identification tag of claim 24, a conductive adhesive bonding the radio frequency identification tag circuit chip within the recess.

27. The radio frequency identification tag of claim 26, the conductive adhesive comprising at least one of an anisotropic adhesive and an isotropic adhesive.

28. The radio frequency identification tag of claim 24, the substrate and the cover forming a portion of an article.

29. The radio frequency identification tag of claim 28, the substrate and the cover forming a portion of a laminated package.

30. A radio frequency identification tag comprising a substrate having an antenna formed on a surface thereof, a radio frequency identification tag circuit chip secured to the surface and electrically coupled to the antenna, and a cover secured over the surface, the cover formed to include a cover recess, and the cover recess arranged to surround the radio frequency identification tag circuit chip.

31. The radio frequency identification tag of claim 30, the radio frequency identification tag circuit chip comprising a radio frequency identification tag circuit chip assembly.

32. The radio frequency identification tag of claim 30, a conductive adhesive bonding the radio frequency identification tag circuit chip within the cover recess.

33. The radio frequency identification tag of claim 32, the conductive adhesive comprising at least one of an anisotropic adhesive and an isotropic adhesive.

34. The radio frequency identification tag of claim 30, the substrate and the cover forming a portion of an article.

35. The radio frequency identification tag of claim 34, the substrate and the cover forming a portion of a laminated package.

* * * * *